(12) United States Patent
Dong et al.

(10) Patent No.: US 11,782,109 B2
(45) Date of Patent: Oct. 10, 2023

(54) WIRELESS POWER FEEDBACK LOOP AND CONTROL SYSTEM FOR WIRELESS COIL IN MRI SYSTEM

(71) Applicant: Siemens Healthcare GmbH, Erlangen (DE)

(72) Inventors: Wei Ming Dong, Shenzhen (CN); Qiu Yi Zhang, Shenzhen (CN); Zhi Bin Li, Shenzhen (CN); Rui Ling Wu, Shenzhen (CN)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/412,510

(22) Filed: Aug. 26, 2021

(65) Prior Publication Data

US 2022/0065959 A1 Mar. 3, 2022

(30) Foreign Application Priority Data

Aug. 26, 2020 (CN) .......................... 202010872159.8

(51) Int. Cl.
*G01R 33/36* (2006.01)
*G01R 33/3415* (2006.01)
(Continued)

(52) U.S. Cl.
CPC ..... *G01R 33/3692* (2013.01); *G01R 33/3415* (2013.01); *H02J 50/12* (2016.02); *H02J 50/20* (2016.02)

(58) Field of Classification Search
CPC . G01R 33/3692; G01R 33/3415; H02J 50/12; H02J 50/20
See application file for complete search history.

(56) References Cited

U.S. PATENT DOCUMENTS 4,694,254 A 9/1987 Vatis et al.
6,879,852 B1 4/2005 Mueller
(Continued)

FOREIGN PATENT DOCUMENTS

CN 101171761 A 4/2008
CN 104124772 A 10/2014
(Continued)

OTHER PUBLICATIONS

Wang Jian-rong et al. "Frequency, Power and Efficiency Adjustable Magnetic Resonance Energy Emitter" Electronic Design Engineering, vol. 26, No. 14, pp. 101-106, 2018. (w/English Abstract).

*Primary Examiner* — Dixomara Vargas
(74) *Attorney, Agent, or Firm* — Banner & Witcoff Ltd.

(57) ABSTRACT

A local coil may include: a wireless power receiver, for converting electrical energy to AC electricity, the electrical energy being wirelessly received from a power source; an AC-DC converter, for converting the AC electricity to first DC electricity having a first voltage; a DC-DC converter, for converting the first DC electricity to second DC electricity having a second voltage; a comparator, for comparing the first voltage and the second voltage, and generating a level signal on the basis of a comparison result; and a transmitter, for sending the level signal to the power source, such that the power source adjusts an output power of the electrical energy on the basis of the level signal. The wirelessly supplying of power to a local coil as well as power feedback control is achieved to advantageously increase energy transmission efficiency and system robustness.

12 Claims, 7 Drawing Sheets

(51) Int. Cl.
  *H02J 50/12*    (2016.01)
  *H02J 50/20*    (2016.01)

(56) References Cited

U.S. PATENT DOCUMENTS

| | | | |
|---|---|---|---|
| 8,901,779 B2 * | 12/2014 | Kesler | H02J 7/00309 |
| | | | 307/104 |
| 2008/0182524 A1 | 7/2008 | Graesslin et al. | |
| 2010/0259261 A1 | 10/2010 | Saes et al. | |
| 2011/0172938 A1 | 7/2011 | Gu et al. | |
| 2012/0200169 A1 * | 8/2012 | Urano | H02J 50/40 |
| | | | 307/104 |
| 2012/0306269 A1 * | 12/2012 | Kim | B60L 53/126 |
| | | | 307/104 |
| 2013/0271126 A1 | 10/2013 | Griswold et al. | |
| 2016/0329752 A1 * | 11/2016 | Bae | H02J 7/0071 |
| 2017/0093201 A1 * | 3/2017 | Shevde | H02J 50/90 |
| 2017/0115713 A1 * | 4/2017 | Shin | G06F 1/266 |
| 2017/0153307 A1 | 6/2017 | Kawajiri et al. | |
| 2017/0285119 A1 * | 10/2017 | Kanakasabai | H02J 7/0068 |
| 2018/0226829 A1 * | 8/2018 | Bae | H02J 50/40 |
| 2019/0369177 A1 | 12/2019 | Du et al. | |

FOREIGN PATENT DOCUMENTS

| | | |
|---|---|---|
| CN | 107785973 A | 3/2018 |
| CN | 109586423 A | 4/2019 |
| CN | 110557016 A | 12/2019 |
| DE | 102012217526 A1 | 3/2014 |
| JP | 2011101776 A | 5/2011 |
| JP | 2019092935 A | 6/2019 |
| KR | 20130110699 A | 10/2013 |
| WO | 2014176835 A1 | 11/2014 |

\* cited by examiner

WIRELESS POWER FEEDBACK LOOP AND CONTROL SYSTEM FOR WIRELESS COIL IN MRI SYSTEM

CROSS REFERENCE TO RELATED APPLICATIONS

This patent application claims priority to Chinese Patent Application No. 202010872159.8, filed Aug. 26, 2020, which is incorporated herein by reference in its entirety.

BACKGROUND

Field

The present disclosure relates to the technical field of MRI, in particular to a local coil, and a power control system and method for an MRI system.

Related Art

Magnetic resonance imaging (MRI) is an imaging technology involving biomagnetics and nuclear spin which has advanced rapidly with the development of computer technology, electronic circuit technology and superconductor technology. It uses a magnetic field and radio frequency (RF) pulses to induce oscillation of precessing hydrogen nuclei (i.e. H+) in human tissue, to generate RF signals which are processed by a computer to form an image. If an object is placed in a magnetic field and irradiated by suitable electromagnetic waves to produce resonance therein, and electromagnetic waves released thereby are then analyzed, it is possible to learn the positions and types of the atomic nuclei of which the object is composed. On this basis, a precise three-dimensional image of the interior of the object can be drawn. For instance, a moving picture of contiguous slices can be obtained by performing an MRI scan of the human brain, starting at the top of the head and continuing all the way to the foot.

In an MRI system, an RF coil transmits RF pulses to bring about magnetic resonance. A local coil receives a magnetic resonance signal, and sends the magnetic resonance signal to a receive coil channel selector (RCCS) and a receiver.

FIG. 1 is a demonstrative schematic wiring diagram of a conventional local coil.

As can be seen from FIG. 1, in an existing MRI system, the local coil 10 is connected to a socket 12 on a patient bed 13 via a power cable 11. A power cable connecting the socket 12 to an external power supply is also provided in the patient bed 13 (not shown in FIG. 1). The local coil can acquire electrical energy from the external power supply via the socket 12.

However, when the local coil 10 is moved, the power cable 11 moves correspondingly and might touch a scan subject. Furthermore, a scanning region of the local coil 10 is restricted by the length of the power supply line 11. Moreover, the provision of the conductive wire in the patient bed also complicates the structure of the patient bed.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

Figure 1:
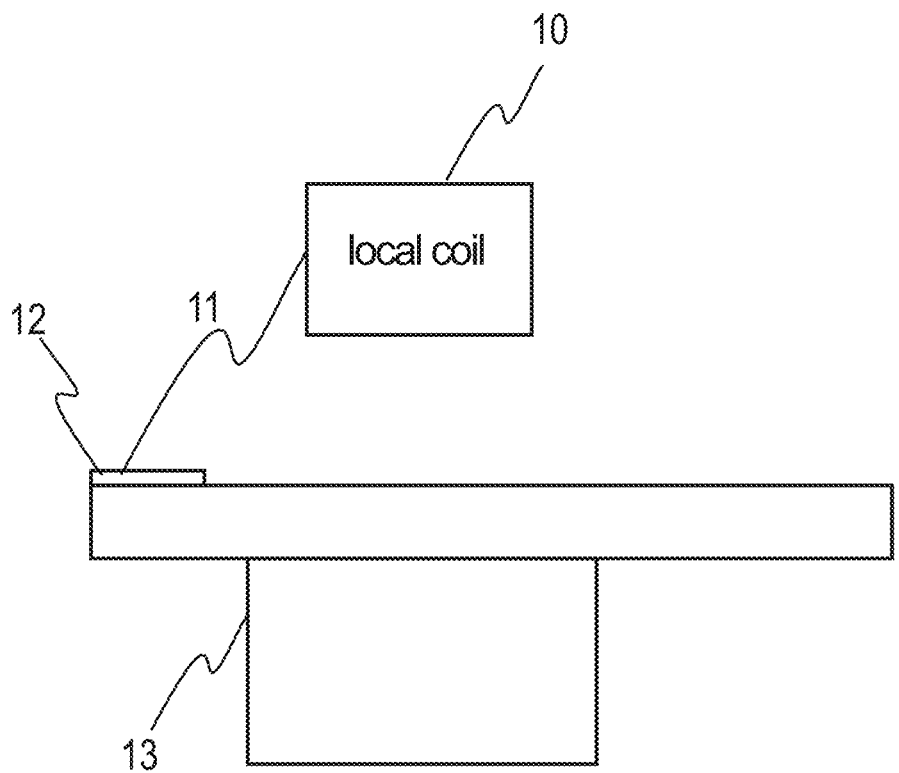
FIG. 1 illustrates a wiring diagram of a conventional local coil.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure. The connections shown in the figures between functional units or other elements can also be implemented as indirect connections, wherein a connection can be wireless or wired. Functional units can be implemented as hardware, software or a combination of hardware and software.

Embodiments of the present disclosure propose a local coil, and a power control system and method for an MRI system.

In an exemplary embodiment, a local coil for an MRI system includes:

a wireless power receiver, for converting electrical energy to AC electricity, the electrical energy being wirelessly received from a power source;

an AC-DC converter, for converting the AC electricity to first DC electricity having a first voltage;

a DC-DC converter, for converting the first DC electricity to second DC electricity having a second voltage;

a comparator, for comparing the first voltage and the second voltage, and generating a level signal on the basis of a comparison result;

a transmitter, for sending the level signal to the power source, such that the power source adjusts an output power of the electrical energy on the basis of the level signal.

As can be seen, embodiments of the present disclosure propose a local coil that wirelessly acquires electrical energy, thus overcoming the difficulties involved in the wiring of power cables, and avoiding the danger associated with a power cable touching a scan subject, while the scanning range of the local coil is no longer restricted by power cable length. Moreover, the local coil can also provide power feedback to a power source, thereby increasing the energy transmission efficiency and robustness. Furthermore, embodiments of the present disclosure achieve power feedback by means of a level signal, which has the advantages of structural simplicity an ease of implementation.

In an exemplary embodiment, the local coil further comprises: a filter, arranged between the wireless power receiver and the AC-DC converter.

Thus, in embodiments of the present disclosure, noise waves can be filtered via the filter.

In an exemplary embodiment, a power control system for an MRI system includes:

a power source, for wirelessly providing electrical energy;

a local coil, comprising: a wireless power receiver, for converting electrical energy to AC electricity, the electrical energy being wirelessly received from the power source; an AC-DC converter, for converting the AC electricity to first DC electricity having a first voltage; a DC-DC converter, for converting the first DC electricity to second DC electricity having a second voltage; a comparator, for comparing the first voltage and the second voltage, and generating a level signal on the basis of a comparison result; a transmitter, for sending the level signal to the power source;

wherein the power source is further configured to adjust an output power of the electrical energy on the basis of the level signal.

Thus, embodiments of the present disclosure propose a power control system for an MRI system, which can wirelessly provide electrical energy for a local coil, and can also increase energy transmission efficiency and robustness based on power feedback. Furthermore, embodiments of the present disclosure achieve power feedback by means of a level signal, which has the advantages of structural simplicity an ease of implementation.

In one or more exemplary embodiments:

when the first voltage is greater than the second voltage, a level value of the level signal is HIGH, and the power source reduces the output power on the basis of the level signal; when the first voltage is less than the second voltage, the level value of the level signal is LOW, and the power source increases the output power on the basis of the level signal; or when the first voltage is greater than the second voltage, a level value of the level signal is LOW, and the power source reduces the output power on the basis of the level signal; when the first voltage is less than the second voltage, the level value of the level signal is HIGH, and the power source increases the output power on the basis of the level signal; or when the first voltage is greater than the second voltage, a level value of the level signal is HIGH, and the power source reduces the output power on the basis of the level signal; when the first voltage is equal to the second voltage, the level value of the level signal is LOW, and the power source maintains the output power on the basis of the level signal; or when the first voltage is greater than the second voltage, a level value of the level signal is LOW, and the power source reduces the output power on the basis of the level signal; when the first voltage is equal to the second voltage, the level value of the level signal is HIGH, and the power source maintains the output power on the basis of the level signal; or when the first voltage is less than the second voltage, a level value of the level signal is HIGH, and the power source increases the output power on the basis of the level signal; when the first voltage is equal to the second voltage, the level value of the level signal is LOW, and the power source maintains the output power on the basis of the level signal; or when the first voltage is less than the second voltage, a level value of the level signal is LOW, and the power source increases the output power on the basis of the level signal; when the first voltage is equal to the second voltage, the level value of the level signal is HIGH, and the power source maintains the output power on the basis of the level signal.

Advantageously, embodiments of the present disclosure can achieve power feedback via several types of level signal, so has a wide scope of applicability.

In an exemplary embodiment, a local coil for an MRI system includes:

a wireless power receiver, for converting electrical energy to AC electricity, the electrical energy being wirelessly received from a power source;

a coupler, for distributing power of the AC electricity according to a predetermined ratio;

an AC-DC converter, for converting AC electricity inputted from the coupler to DC electricity;

an operational amplifier, for determining, based on AC electricity inputted from the coupler, a DC voltage corresponding to a power of AC electricity before distribution;

an analog-digital converter, for converting the DC voltage to a digital quantity;

a transmitter, for sending a DC voltage of the digital quantity to the power source, such that the power source adjusts an output power of the electrical energy on the basis of the DC voltage of the digital quantity.

Advantageously, embodiments of the present disclosure propose a local coil that wirelessly acquires electrical energy, thus overcoming the difficulties involved in the wiring of power cables, and avoiding the danger associated with a power cable touching a scan subject, while the scanning range of the local coil is no longer restricted by power cable length. Moreover, the local coil can also provide power feedback to a power source, thereby increasing the energy transmission efficiency and robustness. Furthermore, embodiments of the present disclosure achieve power feedback via the DC voltage of the digital quantity, which has the advantages of precise adjustment and strong resistance to interference.

In an exemplary embodiment, the local coil further comprises: a filter, arranged between the wireless power receiver and the coupler.

Thus, in embodiments of the present disclosure, noise waves can be filtered via the filter.

In an exemplary embodiment, a power control system for an MRI system includes:

a power source, for wirelessly providing electrical energy;

a local coil, comprising: a wireless power receiver, for converting electrical energy to AC electricity, the electrical energy being wirelessly received from the power source; a coupler, for distributing power of the AC electricity according to a predetermined ratio; an AC-DC converter, for converting AC electricity inputted from the coupler to DC electricity; an operational amplifier, for determining, based on AC electricity inputted from the coupler, a DC voltage corresponding to a power of AC electricity before distribution; an analog-digital converter, for converting the DC voltage to a digital quantity; a transmitter, for sending a DC voltage of the digital quantity to the power source;

the power source being further configured to adjust an output power of the electrical energy on the basis of the DC voltage of the digital quantity.

Thus, embodiments of the present disclosure propose a power control system for an MRI system, which can wirelessly provide electrical energy for a local coil, and can also increase energy transmission efficiency and robustness based on power feedback. Embodiments of the present disclosure achieve power feedback via the DC voltage of the digital quantity, which has the advantages of precise adjustment and strong resistance to interference.

In another embodiment, a table is saved in the power source, the table containing a correspondence between DC voltages and power source output power update values;

the power source is configured to query from the table an output power update value corresponding to the DC voltage, and adjust the output power to the output power update value.

Thus, embodiments of the present disclosure adjust the output power of electrical energy by querying the table, thus reducing operational complexity.

In an exemplary embodiment, a power control method for an MRI system includes:

generating an RF signal;

sending the RF signal, thereby wirelessly transmitting electrical energy to a local coil;

receiving a level signal from the local coil;

adjusting an output power of the electrical energy on the basis of the level signal;

wherein, at the local coil: the electrical energy is converted to AC electricity, the AC electricity is converted to first DC electricity having a first voltage, the first DC electricity is converted to second DC electricity having a second voltage, and the level signal is generated on the basis of a result of comparing the first voltage and the second voltage.

Thus, embodiments of the present disclosure wirelessly provide electrical energy for the local coil, thus overcoming the difficulties involved in the wiring of power cables, and avoiding the danger associated with a power cable touching a scan subject. Moreover, embodiments of the present disclosure increase energy transmission efficiency and robustness, as well as having the advantages of structural simplicity and ease of implementation.

In an exemplary embodiment, a power control method for an MRI system includes: generating an RF signal;

sending the RF signal, thereby wirelessly transmitting electrical energy to a local coil;

receiving a DC voltage of a digital quantity from the local coil;

adjusting an output power of the electrical energy on the basis of the DC voltage of the digital quantity;

wherein, at the local coil: the electrical energy is converted to AC electricity, a power of the AC electricity is measured and the AC electricity is converted to DC electricity, the measured power of the AC electricity is converted to a DC voltage, and the DC voltage is converted to the digital quantity.

Thus, embodiments of the present disclosure wirelessly provide electrical energy for the local coil, thus overcoming the difficulties involved in the wiring of power cables, and avoiding the danger associated with a power cable touching a scan subject. Moreover, embodiments of the present disclosure increase energy transmission efficiency and robustness, as well as having the advantage of precise adjustment.

In an embodiment of the present disclosure, a local coil is proposed which can wirelessly acquire electrical energy. Moreover, the local coil can also provide power feedback to a power source, thereby increasing the energy transmission efficiency and robustness.

Figure 2:
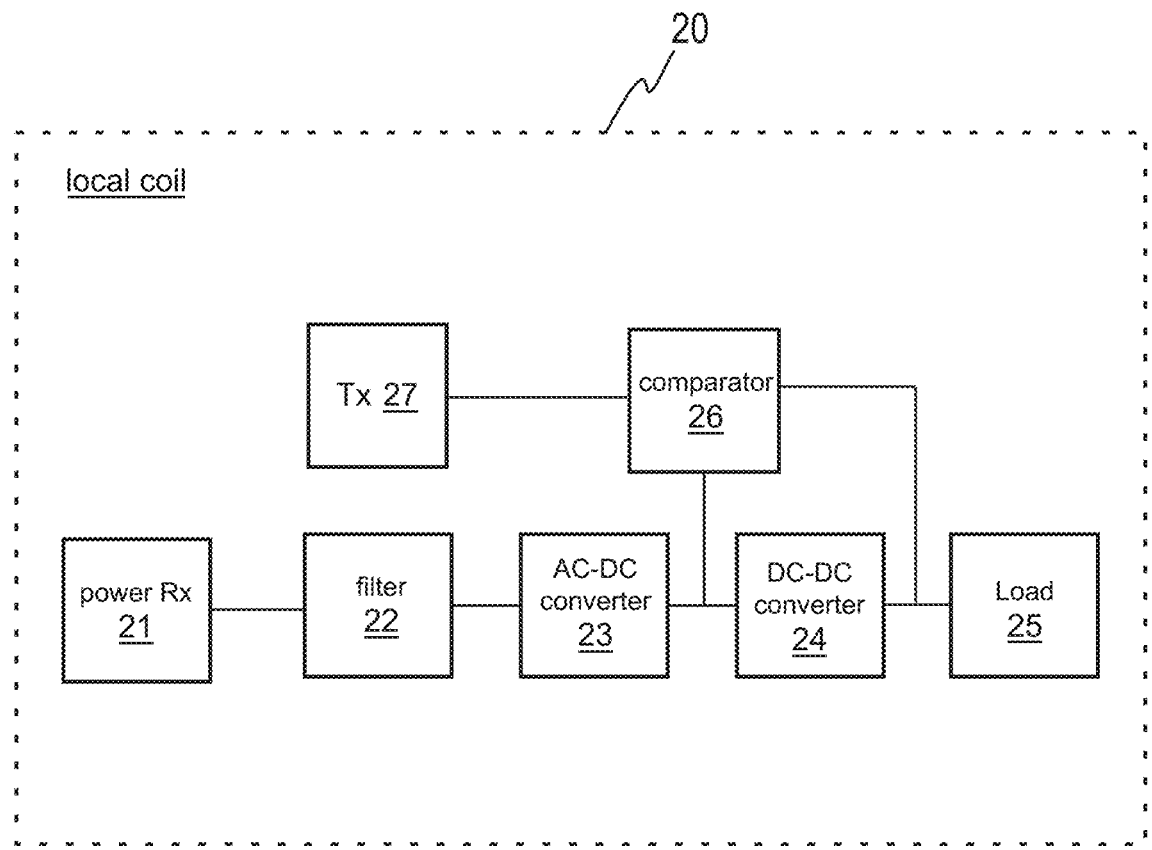
FIG. 2 is a local coil according to an exemplary embodiment of the present disclosure.

FIG. 2 is a first demonstrative structural diagram of a local coil according to an embodiment of the present disclosure.

As shown in FIG. 2, a local coil 20 of an MRI system comprises:

a wireless power receiver 21, for converting electrical energy to AC electricity, the electrical energy being wirelessly received from a power source (not shown in FIG. 2);

an AC-DC converter 23, for converting the AC electricity to first DC electricity having a first voltage;

a DC-DC converter 24, for converting the first DC electricity to second DC electricity having a second voltage;

a comparator 26, for comparing the first voltage and the second voltage, and generating a level signal on the basis of a comparison result;

a transmitter 27, for sending the level signal to the power source, such that the power source adjusts an output power of electrical energy on the basis of the level signal.

In an exemplary embodiment, the local coil 20 (and/or one or more components therein) includes processing circuitry that is configured to perform one or more functions of the local coil 20 (or one or more functions of the respective components therein).

In an exemplary embodiment, the wireless power receiver 21 is configured wirelessly receive electrical energy from the power source such as by electromagnetic induction, magnetic field resonance or radio waves, and convert the electrical energy to AC electricity.

Specifically, in wireless electrical energy transmission based on electromagnetic induction, the wireless power receiver 21 is specifically implemented as a secondary coil; a primary coil in the power source applies AC electricity, generating a current in the secondary coil by electromagnetic induction, and thereby transferring electrical energy from the power source to the local coil 20. In wireless electrical energy transmission based on magnetic field resonance, the power source contains a wireless power transmitting coil, and the wireless power receiver 21 is specifically implemented as a wireless power receiving coil; the wireless power transmitting coil and wireless power receiving coil resonate at a specific frequency, thereby transferring electrical energy from the power source to the local coil 20. In wireless electrical energy transmission based on radio waves, a microwave transmitting apparatus is arranged in the power source, and the wireless power receiver 21 is specifically implemented as a microwave receiving apparatus; the microwave receiving apparatus captures radio wave energy rebounding from a wall, thereby transmitting electrical energy from the power source to the local coil 20.

Typical examples of the wireless transmission of electrical energy between the power source and the local coil 20 have been described demonstratively above, but those skilled in the art will realize that such descriptions are merely demonstrative and not intended to define the scope of protection of the embodiments of the present disclosure An exemplary embodiment of the present disclosure uses magnetic field resonance for the wireless transmission of electrical energy between the power source and the local coil 20.

In one embodiment, a filter 22 is further arranged between the wireless power receiver 21 and the AC-DC converter 23. The filter 22 is configured to filter the AC electricity outputted by the wireless power receiver 21, and send the filtered AC electricity to the AC-DC converter 23.

The AC-DC converter 23 converts the inputted AC electricity to first DC electricity having a first voltage. The first DC electricity is inputted to the DC-DC converter 24. The DC-DC converter 24 converts the first DC electricity to second DC electricity having a second voltage. The second DC electricity is used to provide electrical energy for a load 25 in the local coil 20. The second voltage may be a rated voltage of the load 25 in the local coil 20 (e.g. 3.3 Volts), etc.

In an exemplary embodiment, the load 25 in the local coil 20 may comprise: a receiver, for receiving an analog magnetic resonance signal; an analog/digital conversion circuit, for converting the analog magnetic resonance signal to a digital magnetic resonance signal; a transmitter, for transmitting the digital magnetic resonance signal to a control master computer of the MRI system; etc. In an exemplary embodiment, the load 25 may also contain an energy storage element (e.g. a lithium battery), thereby being able to store electrical energy.

The first DC electricity and second DC electricity are inputted to the comparator 26. The comparator 26 compares the first voltage of the first DC electricity and the second voltage of the second voltage, and generates a level signal on the basis of a comparison result. Moreover, the transmitter 27 is configured to send the level signal to the power source, such that the power source adjusts an output power of electrical energy on the basis of the level signal.

In an exemplary embodiment, the transmitter 27 is configured to send the level signal to the power source via a wired interface or a wireless interface. The wired interface comprises at least one of the following: a universal serial bus interface, controller local area network interface or serial port, etc.; and the wireless interface comprises at least one of the following: an infrared interface, near field communication interface, Bluetooth interface, Zigbee interface, wireless broadband interface, third-generation mobile communication interface, fourth-generation mobile communication interface or fifth-generation mobile communication interface, etc.

Typical examples of wired interfaces and wireless interfaces have been described demonstratively above, but those skilled in the art will realize that such descriptions are merely demonstrative and not intended to define the scope of protection of the embodiments of the present disclosure.

Specific embodiments of the output power of electrical energy being adjusted by the power source on the basis of the level signal sent by the transmitter 27 include:

(1) When the first voltage is greater than the second voltage, the level value of the level signal is HIGH, and the power source reduces the output power on the basis of the level signal; when the first voltage is less than the second voltage, the level value of the level signal is LOW, and the power source increases the output power on the basis of the level signal. The power source can increase or reduce the output power according to a predetermined step length.

Example 1: when the comparator 26 judges that the first voltage (e.g. 10 Volts) is greater than the second voltage (e.g. 3.3 Volts), the level value of the level signal generated by the comparator 26 is HIGH. When the level signal has been transmitted to the power source via the transmitter 27, the power source reduces the output power based on a 10% predetermined step length. Subsequently, the value of the first voltage will fall, and the comparator 26 further generates a level signal on the basis of a detection result for the second voltage and an updated value of the first voltage, the level signal being used to control the power source to adjust the output power. This cycle is repeated, and when the first voltage is updated so as to be equal to the second voltage, the comparator 26 does not generate a level signal, such that the power source maintains the output power.

Example 2: when the comparator 26 judges that the first voltage (e.g. 2 Volts) is less than the second voltage (e.g. 3.3 Volts), the level value of the level signal generated by the comparator 26 is LOW. When the level signal has been transmitted to the power source via the transmitter 27, the power source increases the output power based on a 10% predetermined step length. Subsequently, the value of the first voltage will rise, and the comparator 26 further generates a level signal on the basis of a detection result for the second voltage and an updated value of the first voltage, the level signal being used to control the power source to adjust the output power. This cycle is repeated, and when the first voltage is updated so as to be equal to the second voltage, the comparator 26 does not generate a level signal, such that the power source maintains the output power.

(2) When the first voltage is greater than the second voltage, the level value of the level signal is LOW, and the power source reduces the output power on the basis of the level signal; when the first voltage is less than the second voltage, the level value of the level signal is HIGH, and the power source increases the output power on the basis of the level signal.

Example 1: when the comparator 26 judges that the first voltage (e.g. 10 Volts) is greater than the second voltage (e.g. 3.3 Volts), the level value of the level signal generated by the comparator 26 is LOW. When the level signal has been transmitted to the power source via the transmitter 27, the power source reduces the output power based on a 10% predetermined step length. Subsequently, the value of the first voltage will fall, and the comparator 26 further generates a level signal on the basis of a detection result for the second voltage and an updated value of the first voltage, the level signal being used to control the power source to adjust the output power. This cycle is repeated, and when the first voltage is updated so as to be equal to the second voltage, the comparator 26 does not generate a level signal, such that the power source maintains the output power.

Example 2: when the comparator 26 judges that the first voltage (e.g. 2 Volts) is less than the second voltage (e.g. 3.3 Volts), the level value of the level signal generated by the comparator 26 is HIGH. When the level signal has been transmitted to the power source via the transmitter 27, the power source increases the output power based on a 10% predetermined step length. Subsequently, the value of the first voltage will rise, and the comparator 26 further generates a level signal on the basis of a detection result for the second voltage and an updated value of the first voltage, the level signal being used to control the power source to adjust the output power. This cycle is repeated, and when the first voltage is updated so as to be equal to the second voltage, the comparator 26 does not generate a level signal, such that the power source maintains the output power.

(3) When the first voltage is greater than the second voltage, the level value of the level signal is HIGH, and the power source reduces the output power on the basis of the level signal; when the first voltage is equal to the second voltage, the level value of the level signal is LOW, and the power source maintains the output power on the basis of the level signal.

Example: the power source outputs a high output power at an initial moment; at this time, when the comparator 26 judges that the first voltage (e.g. 10 Volts) is greater than the second voltage (e.g. 3.3 Volts), the level value of the level signal generated by the comparator 26 is HIGH. When the level signal has been transmitted to the power source via the transmitter 27, the power source reduces the output power based on a 10% predetermined step length. Subsequently, the value of the first voltage will fall, and the comparator 26 further generates a level signal on the basis of a detection result for the second voltage and an updated value of the first voltage, the level signal being used to control the power source to adjust the output power. This cycle is repeated, and when the first voltage is updated so as to be equal to the second voltage, the level value of the level signal generated by the comparator 26 is LOW. When the level signal has been transmitted to the power source via the transmitter 27, the power source maintains the output power.

(4) When the first voltage is greater than the second voltage, the level value of the level signal is LOW, and the power source reduces the output power on the basis of the level signal; when the first voltage is equal to the second voltage, the level value of the level signal is HIGH, and the power source maintains the output power on the basis of the level signal.

Example: the power source outputs a high output power at an initial moment; at this time, when the comparator 26 judges that the first voltage (e.g. 10 Volts) is greater than the second voltage (e.g. 3.3 Volts), the level value of the level signal generated by the comparator 26 is LOW. When the level signal has been transmitted to the power source via the transmitter 27, the power source reduces the output power based on a 10% predetermined step length. Subsequently, the value of the first voltage will fall, and the comparator 26 further generates a level signal on the basis of a detection result for the second voltage and an updated value of the first voltage, the level signal being used to control the power source to adjust the output power. This cycle is repeated, and when the first voltage is updated so as to be equal to the second voltage, the level value of the level signal generated by the comparator 26 is HIGH. When the level signal has been transmitted to the power source via the transmitter 27, the power source maintains the output power.

(5) When the first voltage is less than the second voltage, the level value of the level signal is HIGH, and the power source increases the output power on the basis of the level signal; when the first voltage is equal to the second voltage, the level value of the level signal is LOW, and the power source maintains the output power on the basis of the level signal.

Example: the power source outputs a low output power at an initial moment; at this time, when the comparator 26 judges that the first voltage (e.g. 2 Volts) is less than the second voltage (e.g. 3.3 Volts), the level value of the level signal generated by the comparator 26 is HIGH. When the level signal has been transmitted to the power source via the transmitter 27, the power source increases the power based on a 10% predetermined step length. Subsequently, the value of the first voltage will rise, and the comparator 26 further generates a level signal on the basis of a detection result for the second voltage and an updated value of the first voltage, the level signal being used to control the power source to adjust the output power. This cycle is repeated, and when the first voltage is updated so as to be equal to the second voltage, the level value of the level signal generated by the comparator 26 is LOW. When the level signal has been transmitted to the power source via the transmitter 27, the power source maintains the output power.

(6) When the first voltage is less than the second voltage, the level value of the level signal is LOW, and the power source increases the output power on the basis of the level signal; when the first voltage is equal to the second voltage, the level value of the level signal is HIGH, and the power source maintains the output power on the basis of the level signal.

Example: the power source outputs a low output power at an initial moment; at this time, when the comparator 26 judges that the first voltage (e.g. 2 Volts) is less than the second voltage (e.g. 3.3 Volts), the level value of the level signal generated by the comparator 26 is LOW. When the level signal has been transmitted to the power source via the transmitter 27, the power source increases the power based on a 10% predetermined step length. Subsequently, the value of the first voltage will rise, and the comparator 26 further generates a level signal on the basis of a detection result for the second voltage and an updated value of the first voltage, the level signal being used to control the power source to adjust the output power. This cycle is repeated, and when the first voltage is updated so as to be equal to the second voltage, the level value of the level signal generated by the comparator 26 is HIGH. When the level signal has been transmitted to the power source via the transmitter 27, the power source maintains the output power.

Typical examples of the adjustment of output power by the power source on the basis of the level signal have been described demonstratively above. Those skilled in the art will realize that such a description is purely demonstrative, and not intended to define the embodiments of the present disclosure.

As can be seen, in embodiments of the present disclosure, the output power of the power source can be controlled by power feedback of the local coil, and power consumption can thereby be reduced. Furthermore, the outputting of power feedback on the basis of the level signal in embodiments of the present disclosure also has the advantages of structural simplicity and ease of implementation.

Figure 3:
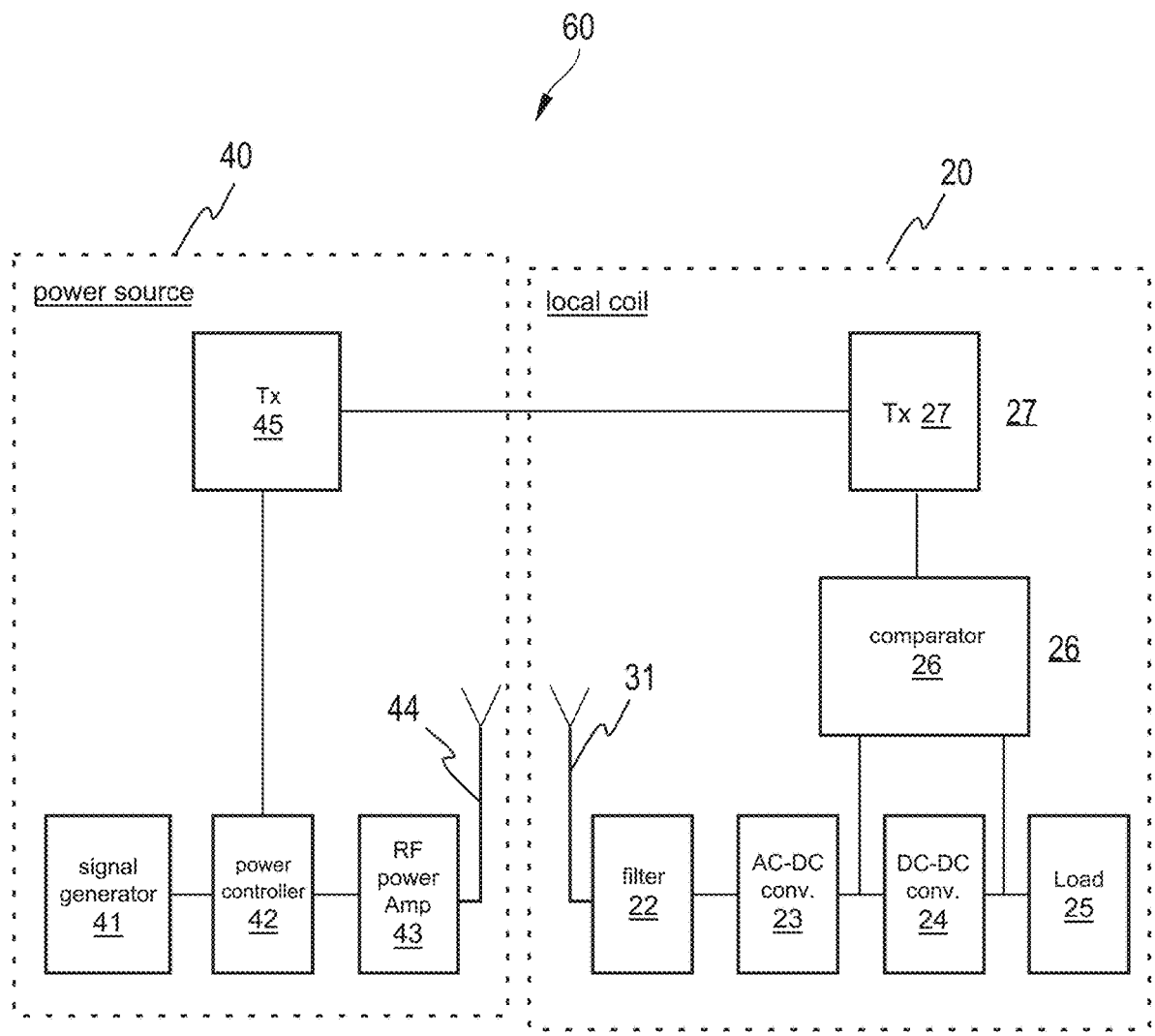
FIG. 3 is a power control system of an MRI system according to an exemplary embodiment of the present disclosure.

FIG. 3 is a first demonstrative structural diagram of a power control system of an MRI system according to an embodiment of the present disclosure.

In FIG. 3, the power control system 60 comprises a power source 40 and a local coil 20. The local coil 20 contains the structure as shown in FIG. 2, wherein the wireless power receiver 21 in FIG. 2 is specifically implemented as a wireless power receiving coil 31. In an exemplary embodiment, the power source 40 (and/or one or more components therein) includes processing circuitry that is configured to perform one or more functions of the power source 40 (or one or more functions of the respective components therein).

In an exemplary embodiment, the power source 40 comprises a signal generator 41, a power controller 42, an RF power amplifier (RFPA) 43, a wireless power transmitting coil 44 and a transmitter 45. The signal generator 41 generates an RF signal such as a single side band (SSB) RF signal. The power controller 42 can adjust an output power of the RF power amplifier 43. The wireless power transmitting coil 44 transmits an RF signal according to the output power which is outputted by the RF power amplifier 43 and controlled by the power controller 42. The wireless power transmitting coil 44 and wireless power receiving coil 31 resonate at a specific frequency. Thus, electrical energy of the RF signal is transferred from the power source 40 to the local coil 20. Moreover, the transmitter 45 in the power source 40 receives a level signal from the transmitter 27 in the local coil 20. The power controller 42 adjusts the output power of the RF power amplifier 43 on the basis of the level signal.

The power source 40 can be arranged on a patient bed. Alternatively, the power source 40 can be arranged at any corner of an examination room in which the local coil 20 is situated, e.g. a ceiling or floor, etc.

Figure 4:
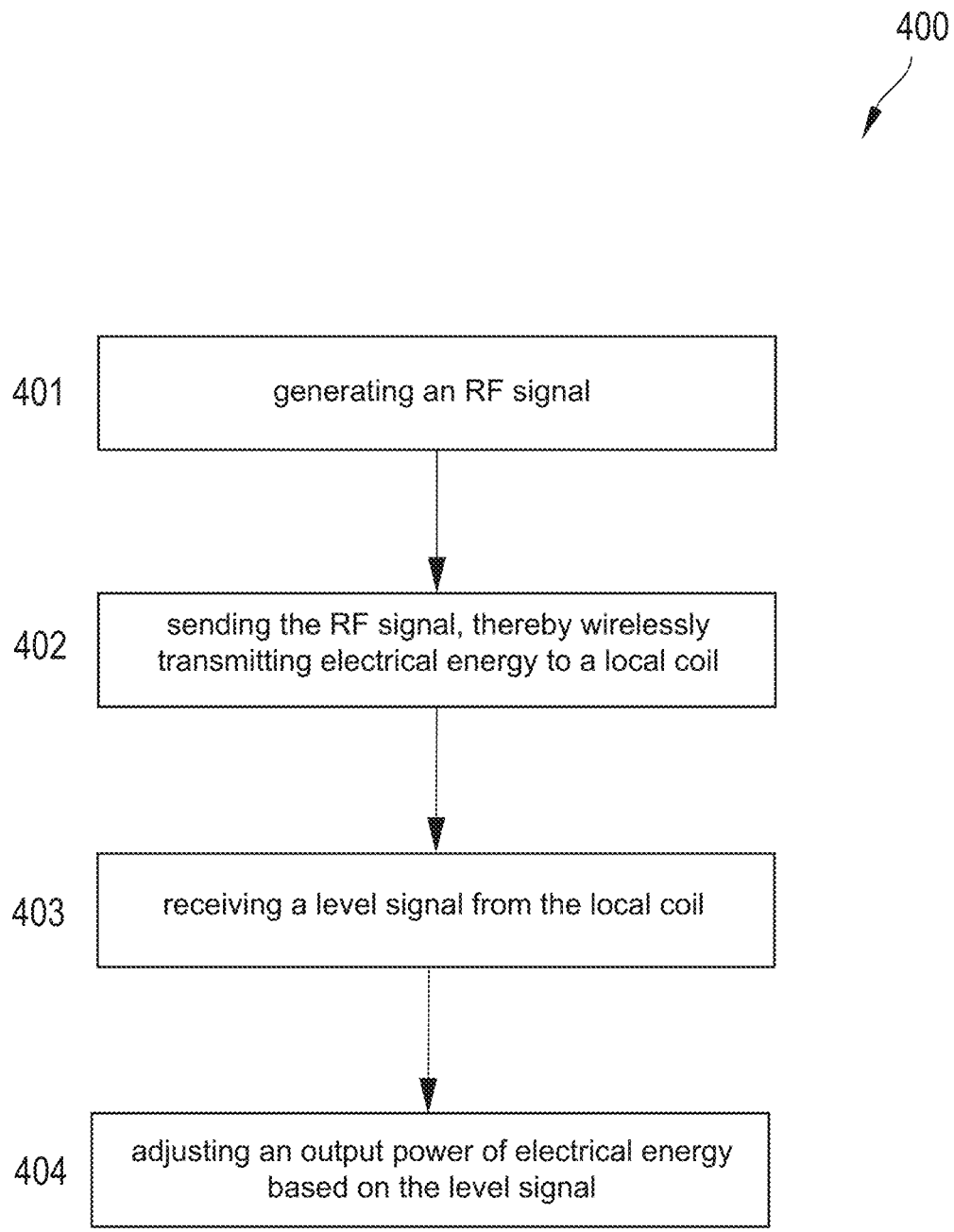
FIG. 4 is a flow chart of a power control method for an MRI system according to an exemplary embodiment of the present disclosure.

FIG. 4 is a first demonstrative flow chart of a power control method for an MRI system according to an embodiment of the present disclosure. The method is suitable for implementation at the power source side.

As shown in FIG. 4, the method 400 comprises:

Step 401: generating an RF signal.

Step 402: sending the RF signal, thereby wirelessly transmitting electrical energy to a local coil.

Step 403: receiving a level signal from the local coil.

Step 404: adjusting an output power of electrical energy on the basis of the level signal, wherein, at the local coil: electrical energy is converted to AC electricity, the AC electricity is converted to first DC electricity having a first voltage, the first DC electricity is converted to second DC electricity having a second voltage, and the level signal is generated on the basis of a result of comparing the first voltage and the second voltage.

Figure 5:
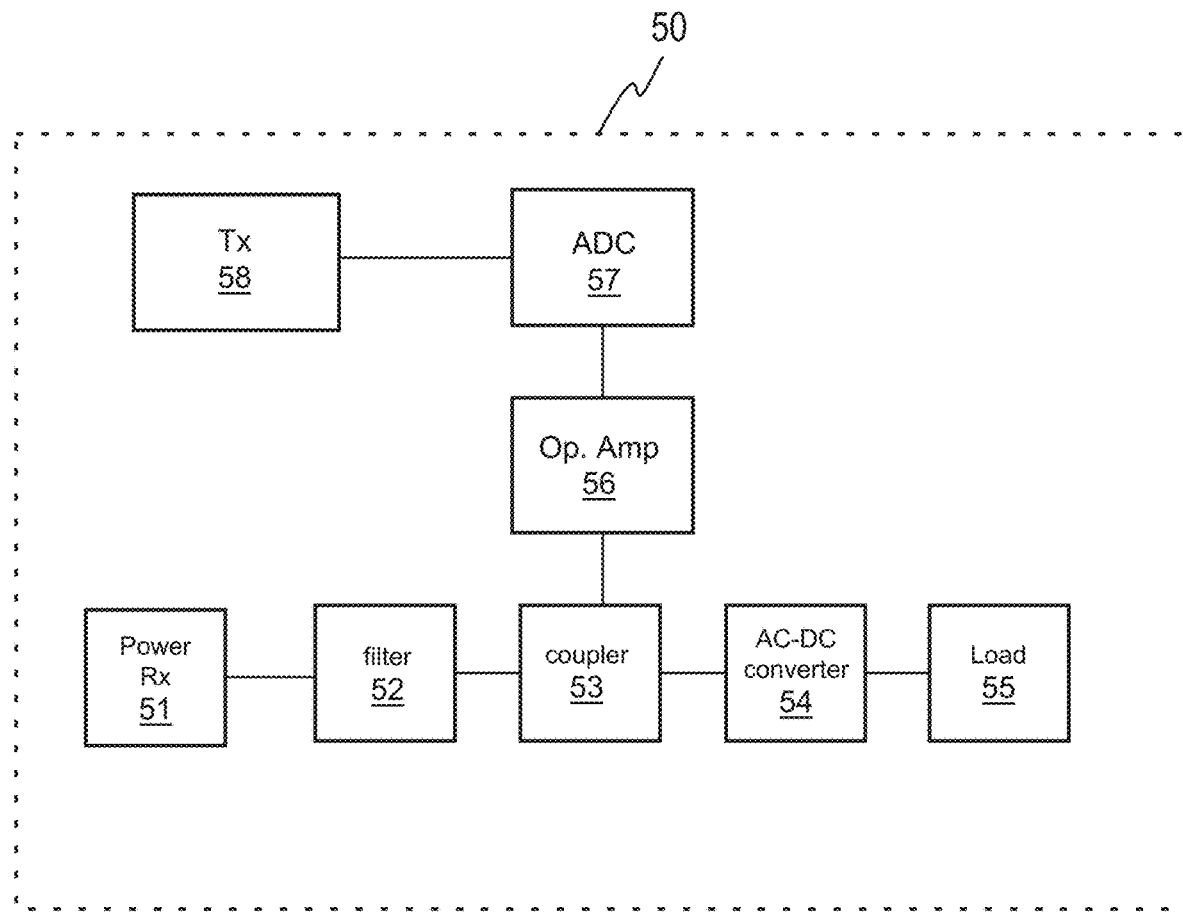
FIG. 5 is a local coil according to an exemplary embodiment of the present disclosure.

Another local coil is further proposed in embodiments of the present disclosure. FIG. 5 is a second demonstrative structural diagram of a local coil according to an embodiment of the present disclosure.

As shown in FIG. 5, in an exemplary embodiment, a local coil 50 of an MRI system comprises:

a wireless power receiver 51, for converting electrical energy to AC electricity, the electrical energy being wirelessly received from a power source;

a coupler 53, for distributing power of AC electricity according to a predetermined ratio, wherein a portion of power of AC electricity is outputted to an AC-DC converter 54, and the remaining power of AC electricity is outputted to an operational amplifier 56;

the AC-DC converter 54, for converting AC electricity inputted from the coupler 53 to DC electricity;

the operational amplifier 56, for determining, based on AC electricity inputted from the coupler 53, a DC voltage corresponding to a power of AC electricity before distribution;

an analog-digital converter 57, for converting the DC voltage to a digital quantity;

a transmitter 58, for sending a DC voltage of the digital quantity to the power source, such that the power source adjusts an output power on the basis of the DC voltage of the digital quantity.

In an exemplary embodiment, the local coil 50 (and/or one or more components therein) includes processing circuitry that is configured to perform one or more functions of the local coil 50 (or one or more functions of the respective components therein).

In an exemplary embodiment, the wireless power receiver 51 is configured to wirelessly receive electrical energy from the power source such as by electromagnetic induction, magnetic field resonance or radio waves, and convert the electrical energy to AC electricity.

Specifically, in wireless electrical energy transmission based on electromagnetic induction, the wireless power receiver 51 is specifically implemented as a secondary coil; a primary coil in the power source applies AC electricity, generating a current in the secondary coil by electromagnetic induction, and thereby transferring electrical energy from the power source to the local coil 50. In wireless electrical energy transmission based on magnetic field resonance, the power source contains a wireless power transmitting coil, and the wireless power receiver 51 is specifically implemented as a wireless power receiving coil; the wireless power transmitting coil and wireless power receiving coil resonate at a specific frequency, thereby transferring electrical energy from the power source to the local coil 50. In wireless electrical energy transmission based on radio waves, a microwave transmitting apparatus is arranged in the power source, and the wireless power receiver 51 is specifically implemented as a microwave receiving apparatus; the microwave receiving apparatus captures radio wave energy rebounding from a wall, thereby transferring electrical energy from the power source to the local coil 50.

Typical examples of the wireless transmission of electrical energy between the power source and the local coil 50 have been described demonstratively above, but those skilled in the art will realize that such descriptions are merely demonstrative and not intended to define the scope of protection of the embodiments of the present disclosure. An exemplary embodiment of the present disclosure uses magnetic field resonance for the wireless transmission of electrical energy between the power source and the local coil 50.

In one embodiment, a filter 52 is further arranged between the wireless power receiver 51 and the coupler 53. The filter 52 is configured to filter the AC electricity outputted by the wireless power receiver 51, and send the filtered AC electricity to the coupler 53.

The coupler 53 distributes power of AC electricity according to a predetermined ratio. Most of the AC electricity is distributed to the AC-DC converter 54, with a remaining very small portion of AC electricity being distributed to the operational amplifier 56 (implemented as a logarithmic amplifier for example). The AC-DC converter 54 converts the AC electricity provided by the coupler 53 to DC electricity. The DC electricity is used to provide electrical energy for a load 55 in the local coil 50.

In one embodiment, a DC-DC converter (not shown in FIG. 5) is arranged between the AC-DC converter 54 and the load 55. The DC-DC converter is configured to convert a voltage of DC electricity provided by the AC-DC converter 54 to a rated voltage of the load 55 (e.g. 3.3. Volts, etc.).

In an exemplary embodiment, the load 55 in the local coil 50 may comprise: a receiver, for receiving an analog magnetic resonance signal; an analog/digital conversion circuit, for converting the analog magnetic resonance signal to a digital magnetic resonance signal; a transmitter, for transmitting the digital magnetic resonance signal to a control master computer of the MRI system; etc. In an exemplary embodiment, the load 55 may also contain an energy storage element (e.g. a lithium battery), thereby being able to store electrical energy.

The operational amplifier 56 determines, based on AC electricity inputted from the coupler 53, a DC voltage corresponding to a power of AC electricity before distribution. For example, the operational amplifier 56 determines a DC voltage of AC electricity inputted from the coupler 53, and then based on a power distribution ratio of the coupler 53, determines a DC voltage corresponding to a power of AC electricity before distribution.

The analog-digital converter 57 converts the DC voltage outputted by the operational amplifier 56 to a digital quantity. The transmitter 58 sends a DC voltage of the digital quantity to the power source, such that the power source adjusts an output power on the basis of the DC voltage of the digital quantity.

The transmitter 58 can send a level signal to the power source via a wired interface or a wireless interface. The wired interface comprises at least one of the following: a universal serial bus interface, controller local area network interface or serial port, etc.; and the wireless interface comprises at least one of the following: an infrared interface, near field communication interface, Bluetooth interface, Zigbee interface, wireless broadband interface, third-generation mobile communication interface, fourth-generation mobile communication interface or fifth-generation mobile communication interface, etc.

Typical examples of wired interfaces and wireless interfaces have been described demonstratively above, but those skilled in the art will realize that such descriptions are merely demonstrative and not intended to define the scope of protection of the embodiments of the present disclosure.

A table is saved in the power source, the table containing a correspondence between local coil DC voltages and power source output power update values. Based on the DC voltage provided by the transmitter 58, the power source queries a corresponding output power update value from the table, and adjusts the output power to the output power update value.

For example, suppose that an expected value of the DC voltage of the local coil is 5 Volts. A table is generated in advance, based on test calibration work, with the following being saved in the table: a correspondence between the present value of the DC voltage and the output power value of the power source that causes the DC voltage to reach 5 Volts from the present value. The DC voltage provided by the transmitter 58 is the present value of the DC voltage; thus, by using the DC voltage provided by the transmitter 58 as a search term to query the table, it is possible to obtain the output power value of the power source (i.e. the output power update value) when the DC voltage provided by the transmitter 58 reaches 5 Volts, and adjust the output power to the output power update value. An embodiment in which the output power is adjusted on the basis of the DC voltage of the local coil has the advantages of rapid power adjustment and strong resistance to interference.

Figure 6:
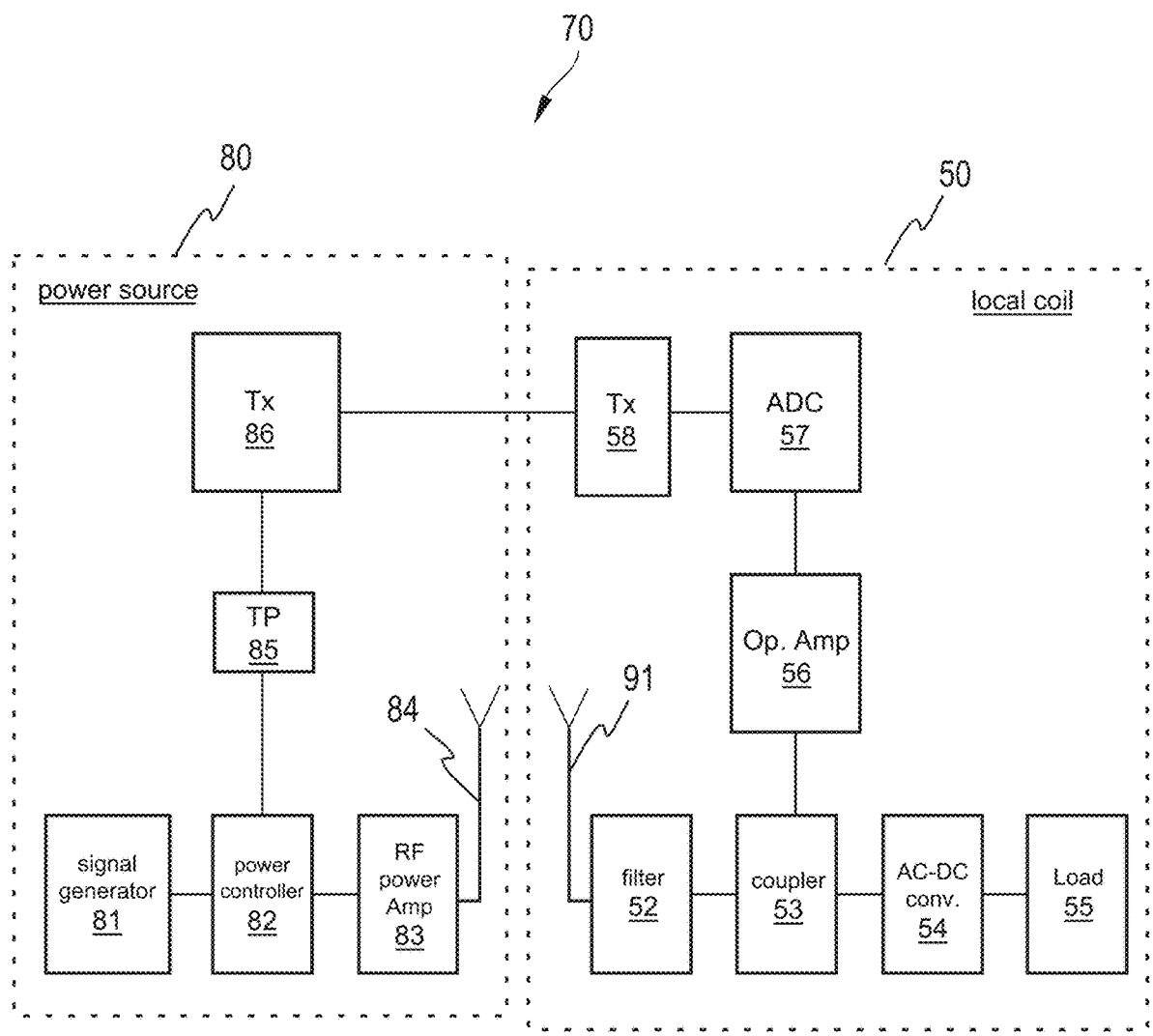
FIG. 6 is a power control system of an MRI system according to an exemplary embodiment of the present disclosure.

FIG. 6 is a second demonstrative structural diagram of a power control system of an MRI system according to an embodiment of the present disclosure. In FIG. 6, according to an exemplary embodiment, the power control system 70 comprises a power source 80 and a local coil 50. The local coil 50 contains the structure as shown in FIG. 5, wherein the wireless power receiver 51 in FIG. 5 is specifically implemented as a wireless power receiving coil 91. In an exemplary embodiment, the power source 80 (and/or one or more components therein) includes processing circuitry that is configured to perform one or more functions of the power source 80 (or one or more functions of the respective components therein).

In an exemplary embodiment, the power source 80 comprises a signal generator 81, a power controller 82, an RF power amplifier 83, a wireless power transmitting coil 84, a table processor 85 and a transmitter 86. The signal generator 81 generates an RF signal such as a single side band RF signal. The power controller 82 can adjust an output power of the RF power amplifier 83. The wireless power transmitting coil 84 transmits the RF signal on the basis of the output power which is outputted by the RF power amplifier 83 and controlled by the power controller 82. The wireless power transmitting coil 84 and wireless power receiving coil 91 resonate at a specific frequency. Thus, electrical energy of the RF signal is transferred from the power source 80 to the local coil 50. Moreover, the transmitter 86 in the power source 80 receives a DC voltage of the local coil from the transmitter 58 in the local coil 50. The power controller 82 adjusts the output power of the RF power amplifier 83 on the basis of the DC voltage of the local coil. In an exemplary embodiment, the table processor 85 is configured to query (from the table) an output power update value corresponding to the DC voltage, and adjust the output power to the output power update value. The table is saved in the power source 80 and contains a correspondence between DC voltages and power source output power update values.

The power source 80 can be arranged on a patient bed. Alternatively, the power source 80 can be arranged at any corner of an examination room in which the local coil 50 is situated, e.g. a ceiling or floor, etc.

Figure 7:
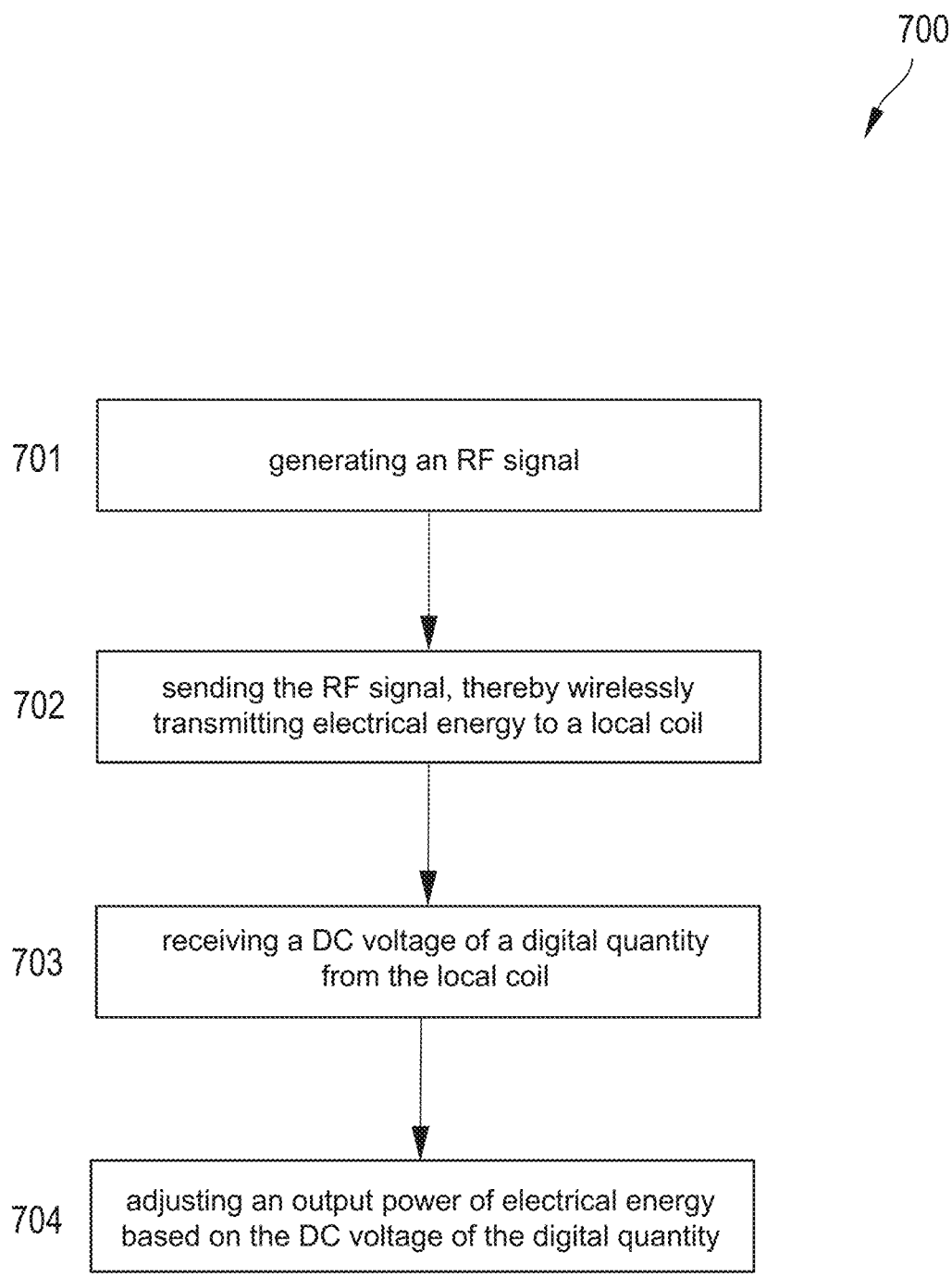
FIG. 7 is a flowchart of a power control method for an MRI system according to an exemplary embodiment of the present disclosure.

FIG. 7 is a second demonstrative flow chart of a power control method for an MRI system according to an embodiment of the present disclosure. The method is suitable for implementation at the power source side.

As shown in FIG. 7, the method 700 comprises:

Step 701: generating an RF signal.

Step 702: sending the RF signal, thereby wirelessly transmitting electrical energy to a local coil.

Step 703: receiving a DC voltage of a digital quantity from the local coil.

Step 704: adjusting an output power of the electrical energy on the basis of the DC voltage of the digital quantity, wherein, at the local coil: electrical energy is converted to AC electricity, a power of the AC electricity is measured and the AC electricity is converted to DC electricity, the measured power of the AC electricity is converted to a DC voltage, and the DC voltage is converted to a digital quantity.

Based on the description above, embodiments of the present disclosure further propose a power source having a memory-processor architecture. The power source comprises a processor, a memory, and a computer program that is stored on the memory and capable of being run on the processor; when executed by the processor, the computer program implements any one of the power control methods for an MRI system as described above. The memory may specifically be implemented as various types of storage media, such as an electrically erasable programmable read-only memory (EEPROM), a flash memory or a programmable read-only memory (PROM). The processor may be implemented as comprising one or more central processors or one or more field-programmable gate arrays, wherein the field-programmable gate array integrates one or more central processor cores. Specifically, the central processor or central processor core may be implemented as a CPU or MCU or DSP, etc.

It must be explained that not all of the steps and modules in the flows and structural diagrams above are necessary; certain steps or modules may be omitted according to actual requirements. The order in which steps are executed is not fixed, but may be adjusted as required. The partitioning of the modules is merely functional partitioning, employed for the purpose of facilitating description; during actual implementation, one module may be realized by multiple modules, and the functions of multiple modules may be realized by the same module; these modules may be located in the same device, or in different devices. Hardware modules in the embodiments may be realized mechanically or electronically. For example, one hardware module may comprise a specially designed permanent circuit or logic device (such as a dedicated processor, such as an FPGA or ASIC) for completing a specific operation. The hardware module may also comprise a programmable logic device or circuit that is temporarily configured by software (e.g. comprising a general processor or another programmable processor) for executing a specific operation. The choice of whether to specifically use a mechanical method, or a dedicated permanent circuit, or a temporarily configured circuit (e.g. configured by software) to realize the hardware module can be decided according to considerations of cost and time.

The present disclosure also provides a machine-readable storage medium, in which is stored an instruction for causing a machine to execute the method according to the present application. Specifically, a system or apparatus equipped with a storage medium may be provided; software program code realizing the function of any one of the embodiments above is stored on the storage medium, and a computer (or CPU or MPU) of the system or apparatus is caused to read and execute the program code stored in the storage medium. Furthermore, it is also possible to cause an operating system etc. operating on a computer to complete a portion of, or all, actual operations by means of an instruction based on program code. It is also possible for program code read out from the storage medium to be written into a memory installed in an expansion board inserted in the computer, or written into a memory installed in an expansion unit connected to the computer, and thereafter instructions based on the program code cause a CPU etc. installed on the expansion board or expansion unit to execute a portion of and all actual operations, so as to realize the function of any one of the embodiments above. Embodiments of storage media used for providing program code include floppy disks, hard disks, magneto-optical disks, optical disks (such as CD-ROM, CD-R, CD-RW, DVD-ROM, DVD-RAM, DVD-RW, DVD+RW), magnetic tapes, non-volatile memory cards and ROM.

As used herein, "schematic" means "serving as an instance, example or illustration". No drawing or embodiment described herein as "schematic" should be interpreted as a more preferred or more advantageous technical solution. To make the drawings appear uncluttered, only those parts relevant to the present disclosure are shown schematically in the drawings; they do not represent the actual structure thereof as a product. Furthermore, to make the drawings appear uncluttered for ease of understanding, in the case of components having the same structure or function in certain drawings, only one of these is drawn schematically, or only one is marked. As used herein, "a" does not indicate that the quantity of the relevant part of the present disclosure is limited to "only this one", and "a" does not indicate the exclusion of cases where the quantity of the relevant part of the present disclosure is "more than one". As used herein, "upper", "lower", "front", "rear", "left", "right", "inner" and "outer", etc., are merely used to indicate the relative positional relationships among relevant parts, without defining the absolute positions of these relevant parts.

The embodiments above are merely exemplary embodiments of the present disclosure, which are not intended to define the scope of protection of the present disclosure. Any amendments, equivalent substitutions or improvements etc. made within the spirit and principles of the present disclosure shall be included in the scope of protection thereof.

To enable those skilled in the art to better understand the solution of the present disclosure, the technical solution in the embodiments of the present disclosure is described clearly and completely below in conjunction with the drawings in the embodiments of the present disclosure. Obviously, the embodiments described are only some, not all, of the embodiments of the present disclosure. All other embodiments obtained by those skilled in the art on the basis of the embodiments in the present disclosure without any creative effort should fall within the scope of protection of the present disclosure.

It should be noted that the terms "first", "second", etc. in the description, claims and abovementioned drawings of the present disclosure are used to distinguish between similar objects, but not necessarily used to describe a specific order or sequence. It should be understood that data used in this way can be interchanged as appropriate so that the embodiments of the present disclosure described here can be implemented in an order other than those shown or described here. In addition, the terms "comprise" and "have" and any variants thereof are intended to cover non-exclusive inclusion. For example, a process, method, system, product or equipment comprising a series of steps or modules or units is not necessarily limited to those steps or modules or units which are clearly listed, but may comprise other steps or modules or units which are not clearly listed or are intrinsic to such processes, methods, products or equipment.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general-purpose computer.

For the purposes of this discussion, the term "processing circuitry" shall be understood to be circuit(s) or processor(s), or a combination thereof. A circuit includes an analog circuit, a digital circuit, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein. In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

REFERENCE LIST

10 Local coil
11 Power cable
12 Socket
13 Patient bed
30 Local coil
21 Wireless power receiver
22 Filter
23 AC-DC converter
24 DC-DC converter
25 Load
26 Comparator
27 Transmitter
60 Power control system for MRI system
40 Power source
41 Signal generator
42 Power controller
43 RF power amplifier
44 Wireless power transmitting coil
45 Transmitter
400 Power control method for MRI system
401-404 operations
50 Local coil
51 Wireless power receiver
52 Filter
53 Coupler
54 AC-DC converter
55 Load
56 Operational amplifier
57 Analog-digital converter
58 Transmitter
70 Power control system for MRI system
80 Power source
91 Wireless power receiving coil
81 Signal generator
82 Power controller
83 RF power amplifier
84 Wireless power transmitting coil
85 Table processor
86 Transmitter
700 Power control method for MRI system
701-704 operations

The invention claimed is:

1. A local coil for a magnetic resonance imaging (MRI) system, comprising:
a wireless power receiver configured to convert electrical energy to alternating current (AC) electricity, the electrical energy being wirelessly received from a power source;
an alternating current-direct current (AC-DC) converter configured to convert the AC electricity to first DC electricity having a first voltage;
a direct current-direct current (DC-DC) converter configured to convert the first DC electricity to second DC electricity having a second voltage;
a comparator configured to compare the first voltage and the second voltage, and generate a level signal based on the comparison result; and
a transmitter configured to send the level signal to the power source, the power source adjusting an output power of the electrical energy based on the level signal.

2. The local coil as claimed in claim 1, further comprising:
a filter, arranged between the wireless power receiver and the AC-DC converter.

3. A power control system for a magnetic resonance imaging (MRI) system, comprising:
a power source configured to wirelessly provide electrical energy; and
a local coil, comprising:
a wireless power receiver configured to convert electrical energy to alternating current (AC) electricity, the electrical energy being wirelessly received from the power source;
an AC-direct current (DC) converter configured to convert the AC electricity to first DC electricity having a first voltage;
a DC-DC converter configured to convert the first DC electricity to second DC electricity having a second voltage;
a comparator configured to compare the first voltage and the second voltage, and generating a level signal based on the comparison result; and
a transmitter configured to send the level signal to the power source;
wherein the power source is further configured to adjust an output power of the electrical energy based on the level signal.

4. The power control system as claimed in claim 3, wherein:
when the first voltage is greater than the second voltage, a level value of the level signal is HIGH, and the power source reduces the output power on the basis of the level signal; when the first voltage is less than the second voltage, the level value of the level signal is LOW, and the power source increases the output power on the basis of the level signal; or
when the first voltage is greater than the second voltage, a level value of the level signal is LOW, and the power source reduces the output power on the basis of the level signal; when the first voltage is less than the second voltage, the level value of the level signal is HIGH, and the power source increases the output power on the basis of the level signal; or
when the first voltage is greater than the second voltage, a level value of the level signal is HIGH, and the power source reduces the output power on the basis of the level signal; when the first voltage is equal to the second voltage, the level value of the level signal is LOW, and the power source maintains the output power on the basis of the level signal; or
when the first voltage is greater than the second voltage, a level value of the level signal is LOW, and the power source reduces the output power on the basis of the level signal; when the first voltage is equal to the second voltage, the level value of the level signal is HIGH, and the power source maintains the output power on the basis of the level signal; or
when the first voltage is less than the second voltage, a level value of the level signal is HIGH, and the power source increases the output power on the basis of the level signal; when the first voltage is equal to the second voltage, the level value of the level signal is LOW, and the power source maintains the output power on the basis of the level signal; or when the first voltage is less than the second voltage, a level value of the level signal is LOW, and the power source increases the output power on the basis of the level signal; when the first voltage is equal to the second voltage, the level value of the level signal is HIGH, and the power source maintains the output power on the basis of the level signal.

5. A local coil for a magnetic resonance imaging (MRI) system, comprising:
a wireless power receiver configured to convert electrical energy to alternating current (AC) electricity, the electrical energy being wirelessly received from a power source;
a coupler configured to distribute power of the AC electricity according to a predetermined ratio;
an AC-direct current (DC) converter configured to convert AC electricity from the coupler to DC electricity;
an operational amplifier configured to determine, based on AC electricity from the coupler, a DC voltage corresponding to a power of AC electricity before distribution;
an analog-digital converter (ADC) configured to convert the DC voltage to a digital quantity; and
a transmitter configured to send a DC voltage of the digital quantity to the power source, the power source adjusting an output power of the electrical energy based on the DC voltage of the digital quantity.

6. The local coil as claimed in claim 5, further comprising:
a filter arranged between the wireless power receiver and the coupler.

7. A power control system for a magnetic resonance imaging (MRI) system, comprising:
a power source configured to wirelessly provide electrical energy; and
a local coil, comprising:
a wireless power receiver configured to convert electrical energy to alternating current (AC) electricity, the electrical energy being wirelessly received from the power source;
a coupler configured to distribute power of the AC electricity according to a predetermined ratio;
an AC-direct current (DC) converter configured to convert AC electricity from the coupler to DC electricity;
an operational amplifier configured to determine, based on AC electricity from the coupler, a DC voltage corresponding to a power of AC electricity before distribution;
an analog-digital converter (ADC) configured to convert the DC voltage to a digital quantity; and
a transmitter configured to send a DC voltage of the digital quantity to the power source;

wherein the power source is further configured to adjust an output power of the electrical energy based on the DC voltage of the digital quantity.

8. The power control system according to claim 7, wherein:
the power source further comprise a table stored therein, the table containing a correspondence between DC voltages and power source output power update values; and
the power source is configured to query, from the table, an output power update value corresponding to the DC voltage, and adjust the output power to the output power update value.

9. A power control method for a magnetic resonance imaging (MRI) system, comprising:
generating a radio frequency (RF) signal;
sending the RF signal to wirelessly transmit electrical energy to a local coil;
receiving a level signal from the local coil; and
adjusting an output power of the electrical energy based on the level signal;
wherein, at the local coil: the electrical energy is converted to alternating current (AC) electricity, the AC electricity being converted to first direct current (DC) electricity having a first voltage, the first DC electricity being converted to second DC electricity having a second voltage, and the level signal being generated based on the result of comparing the first voltage and the second voltage.

10. A power control method for a magnetic resonance imaging (MRI) system, comprising:
generating a radio frequency (RF) signal;
sending the RF signal to wirelessly transmit electrical energy to a local coil;
receiving a direct current (DC) voltage of a digital quantity from the local coil;
adjusting an output power of the electrical energy based on the DC voltage of the digital quantity;
wherein, at the local coil: the electrical energy is converted to alternating current (AC) electricity, a power of the AC electricity being measured and the AC electricity being converted to DC electricity, the measured power of the AC electricity being converted to a DC voltage, and the DC voltage being converted to the digital quantity.

11. The local coil as claimed in claim 5, wherein the operational amplifier is configured to determine a distributed DC voltage based on the AC electricity from the coupler, the DC voltage corresponding to the power of AC electricity before distribution being determined based on the distributed DC voltage and the predetermined ratio, wherein the predetermined ratio corresponds to a power distribution ratio of the coupler.

12. The local coil as claimed in claim 5, wherein the operational amplifier is configured to determine the DC voltage corresponding to the power of AC electricity before distribution based on the AC electricity from the coupler and the predetermined ratio.

* * * * *